United States Patent [19]

Fengler

[11] 4,009,680

[45] Mar. 1, 1977

[54] APPARATUS FOR PRODUCING HIGH WEAR-RESISTANT COMPOSITE SEAL

[76] Inventor: Werner H. Fengler, 23651 Fordson Drive, Dearborn, Mich. 48124

[22] Filed: Aug. 13, 1975

[21] Appl. No.: 604,478

Related U.S. Application Data

[62] Division of Ser. No. 506,332, Sept. 16, 1974, Pat. No. 3,991,229.

[52] U.S. Cl. .............................. 118/49.1; 118/641
[51] Int. Cl.² .................................. C23C 13/12
[58] Field of Search .................... 118/48–49.5, 118/500–503, 319; 427/53, 82, 91, 251, 255, 124; 219/121 L, 121 LM; 204/298

[56] References Cited

UNITED STATES PATENTS

| | | | |
|---|---|---|---|
| 2,746,420 | 5/1956 | Steigerwald | 118/49.1 X |
| 2,799,600 | 7/1957 | Scott | 118/49 |
| 3,213,826 | 10/1965 | Lins et al. | 118/49.1 |
| 3,310,423 | 3/1967 | Ingham, Jr. | 427/53 |
| 3,375,804 | 4/1968 | Rausch | 118/49.1 X |
| 3,634,040 | 1/1972 | Johnson et al. | 118/49.1 X |
| 3,801,366 | 4/1974 | Lemelson | 427/53 X |

*Primary Examiner*—Morris Kaplan
*Attorney, Agent, or Firm*—Willis Bugbee

[57] ABSTRACT

A base metal, such as the aluminum or iron housing of a conventional rotary or reciprocating-piston internal combustion engine, and a sealing member applicable to the pistons or rotor thereof are coated with a layer of a wear-resistant alloy, such as molybdenum-ruthenium or tungsten-ruthenium alloy, either by evaporating the elements of the alloy by electron guns onto the surfaces to be coated or by vaporizing a wire of the same alloy in a vacuum chamber by the application of a high-tension electrical discharge through the wire from an electrical condenser bank. Depositing the alloy is done on a production basis by passing workpiece holders in a circular path through a vacuum chamber beneath the electron guns, followed by a realloying step through a laser beam, an acid dip, a rinsing dip, a drying by heat, and a final honing.

4 Claims, 8 Drawing Figures

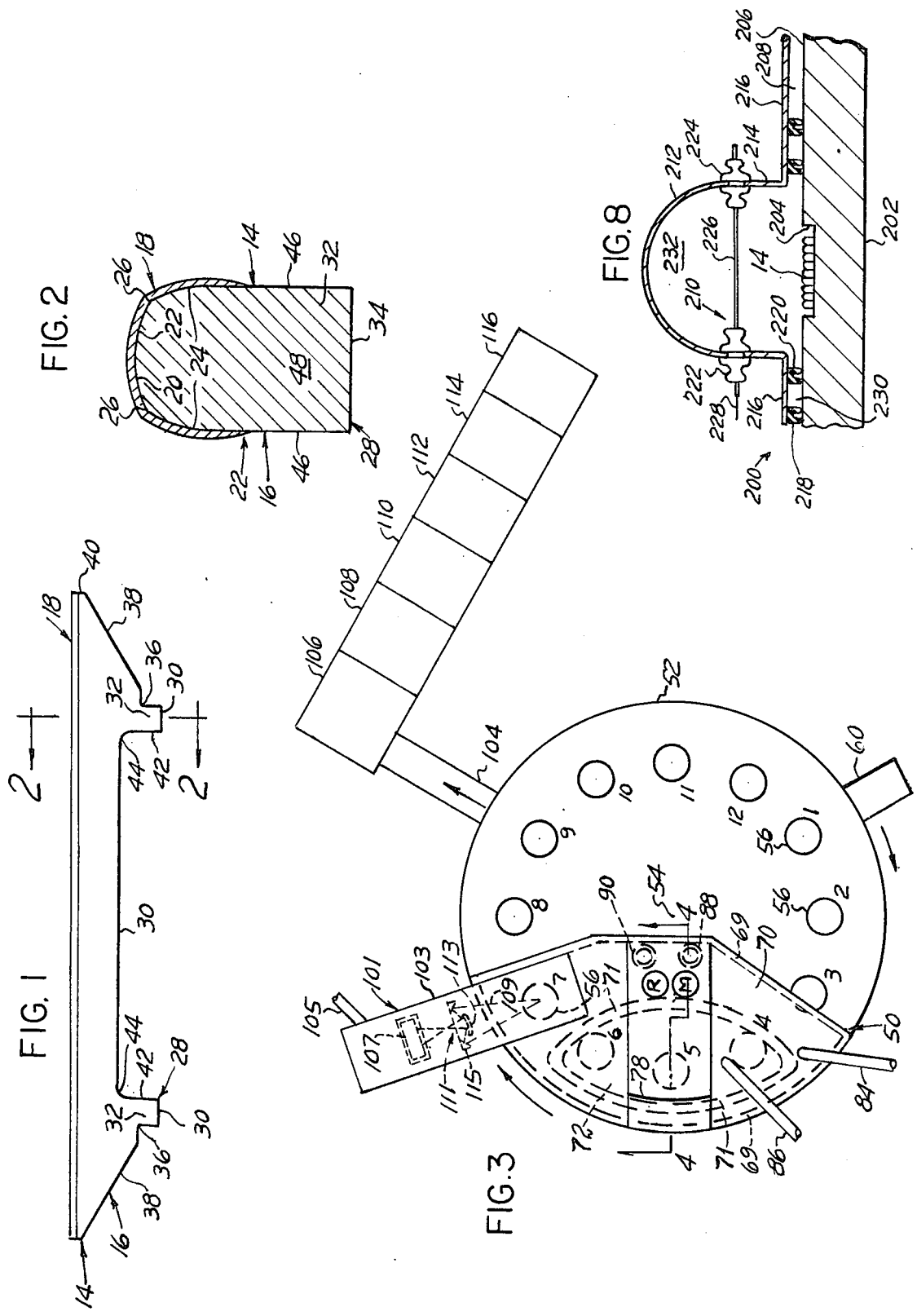

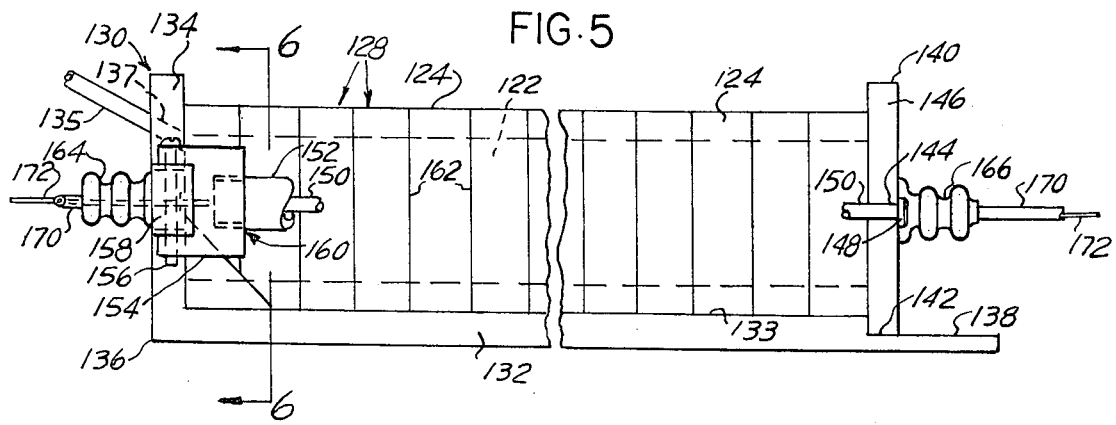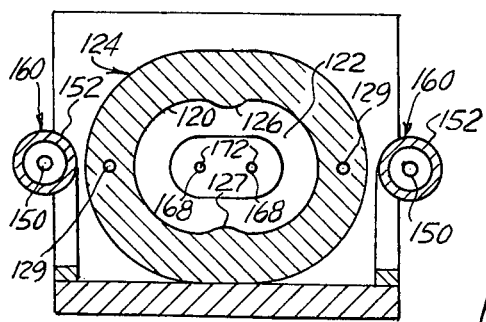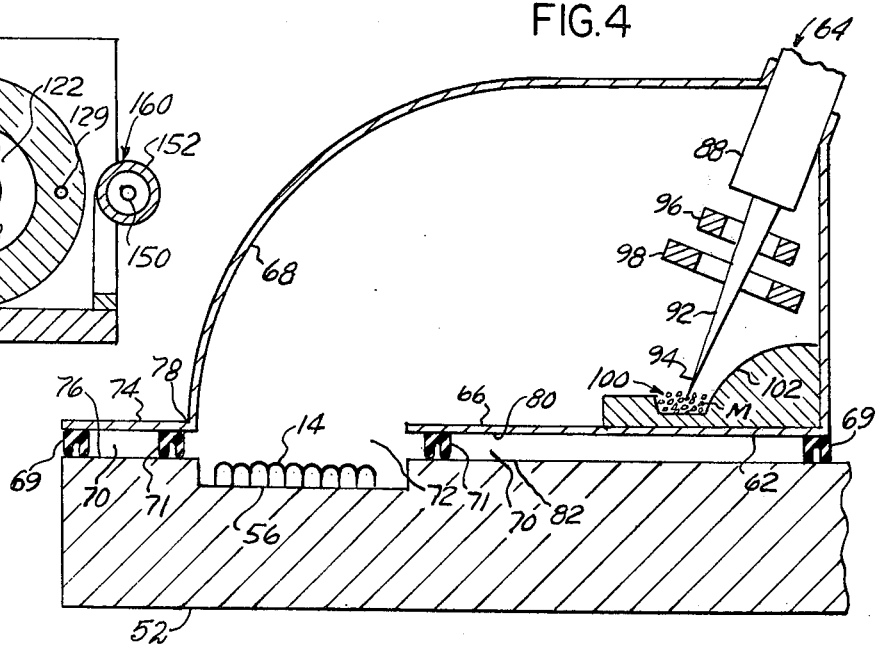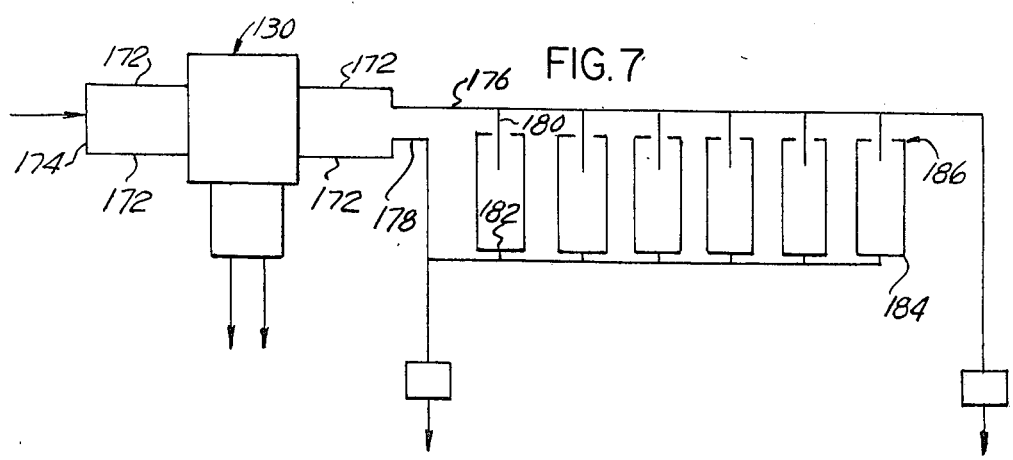

APPARATUS FOR PRODUCING HIGH WEAR-RESISTANT COMPOSITE SEAL

This is a division of my co-pending application, Ser. No. 506,332, filed Sept. 16, 1974, for High-Wear-Resistant Composite Seal and Method of Making the Same, now U.S. Pat. No. 3,991,229 issued Nov. 9, 1976.

BACKGROUND OF THE INVENTION

A critical problem in the rotary internal combustion engine known as the Wankel engine, has been the provision of a sufficiently gas-tight and durable seal between the housing stator and the lobes of the rotor. The lack of a sufficiently durable seal has greatly retarded the introduction of such high-speed engines of medium and large chamber capacity and power. Such engines hitherto attemptedly produced have rapidly destroyed their seals so that leakage soon occurs between the stator and rotor surfaces with the result that the engine has quickly lost power and has become unacceptable to purchasers and unreliable in operating life.

SUMMARY OF THE INVENTION

The wear surfaces of the improved composite seals for the stator and rotor are coated with an extremely high wear-resistant alloy, such as molybdenum-ruthenium or tungsten-ruthenium, thereby enormously lengthening the working life of the engine by the extremely high wear-resistant properties of the said seal-coating alloys.

IN THE DRAWINGS,

FIG. 1 is a side elevation of a high wear-resistant composite rotor seal, according to the invention;

FIG. 2 is an enlarged cross-section taken along the line 2—2 in FIG. 1;

FIG. 3 is a diagrammatic top plan view of a first form of continuous production apparatus for applying the high wear-resistant sealing coating to the base portion of the composite rotor seal of FIGS. 1 and 2;

FIG. 4 is a diagrammatic vertical section, upon an enlarged scale, taken along the line 4—4 in FIG. 3;

FIG. 5 is a diagrammatic side elevation, with portions broken away, of a device for vaporizing a wire of high wear-resistant alloy and applying the vapor as a coating upon the interior of multiple internal combustion engine stators for use with the rotors equipped wit rotor seal of FIGS. 1 and 2;

FIG. 6 is a cross-section along the line 6—6 in FIG. 5, through one of the internal combustion engine stators of the bank thereof being internally coated in FIG. 5;

FIG. 7 is a diagrammatic side elevation of a high-tension electrical energization circuit employed with the vaporization device of FIG. 5; and FIG. 8 is a diagrammatic central vertical section, upon a reduced scale, through a modified continuous production apparatus successive for vaporizing wire portions of high wear-resistant alloy and applying the vapor as a coating upon successive groups of the seals shown in FIG. 1.

Referring to the drawings in detail, FIG. 1 shows a high wear-resistant composite rotor seal, generally designated 14, as consisting generally of a base 16 and a wear-resistant coating 18. The base 16 is in the form of an elongated twin-legged bar which is particularly well adapted for mounting on the tips of the lobes of the rotor of a conventional rotary internal combustion engine (not shown) of the so-called Wankel type having a roughly triangular rotor, the lobes of which rotate in an orbital path relatively to the constricted passageway between the opposite end portions of a roughly FIG. 8-shaped chamber. For this purpose, the base 16 is of elongated shape in the form of a bar having a straight upper surface 20 corresponding to the axial length of the lobe of the rotor upon which it is mounted and having an arcuate configuration in cross-section which has a top portion 22 of longer radius of curvature than the opposite side portions 24 and meeting the latter at opposite junction lines 26 (FIG. 2). The base 16 of the rotor seal 14 has a bottom surface 28 which includes a straight intermediate portion 30 terminating in downwardly-extending leg portions 32 with lower ends 34 from which outer notched portions 36 join upwardly-inclined surfaces 38 terminating in opposite ends 40. The intermediate bottom portion 30 and the inner surfaces 42 of the leg portions 32 form an indentation 44. The thickness of the coating 18 in FIG. 2 is exaggerated in order to render it visible. The base 16 preferably has parallel opposite sides 46 (FIG. 2) which cooperate with the bottom surfaces 34 to form rectangular portions 48 which fit into corresponding paraxial recesses (not shown) in the tips of the three lobes of the engine.

The bar seal coating machine, generally designated 50, shown in FIG. 3 produces the composite bar seal 10 of FIGS. 1 and 2 on a continuous production basis by the evaporating method using conventional electron gun procedure. It consists of a turntable 52 mounted for rotation about a central axis 54 and having multiple magnetic work holders 56 disposed in an annular path concentric with said axis 54 at stations numbered sequentially 1 to 12 inclusive in FIG. 3. At the loading station 60 the work holders 56 are filled with uncoated seal bases 16 mounted with their legs 32 directed downward and with their upper surfaces 20 facing upward (FIG. 2). The turntable 52 is then rotated step-by-step in a clockwise direction with a dwell at each station, as the processing is carried out in a manner described below. The mounting and rotation of the turntable 52 are conventional and well-known in the welding industry and their details are beyond the scope of the present invention. Such a turntable installation for electron beam welding purposes, for example, is manufactured and sold by Sciaky Brothers, Inc., of Chicago, Ill.

Mounted adjacent the periphery of the turntable 52 at one side thereof (FIG. 4) is arranged an electron-gun coating housing 62, generally designated 64. The unit 64 includes a lower wall 66 and an upper wall 68 between which and the upper surface 82 of the turntable 52 are an outer low-vacuum chamber 70 and an inner high-vacuum chamber 72. The housing 62 has an outwardly-extending wall 74 meeting the upper wall 68 along an arcuate junction 78 adjacent the peripheral portion 76 of the upper surface 82 of the turntable 52. The portion of the low-vacuum space chamber 70 between the wall 74 and said peripheral portion 76 is sealed against the entrance of excessive undesired air by conventional and continuous sealing means 69 and 71. Similarly, the low-vacuum chamber 70 between the lower platform surface 80 and the upper turntable surface 82 is sealed by the same conventional and continuous sealing means 69 and 71. Air exhaust pipes 84 and 86 (FIG. 3) lead to conventional low-vacuum and high-vacuum pumps (not shown) respectively.

The electron-gun coating unit 64 consists of two conventional electron guns 88 and 90 which when in operation project electron beams 92 downward. The electron beams 92 (FIG. 4) are converged to a focus 94 by an annulur focussing wire coil 96 and directed to various locations of impact by a positioning wire coil 98. The electron beam 92 from the gun 88 plays upon the powdered molybdenum or tungsten component of the alloy, whereas the electron beam 92 from the gun 90 plays upon the powdered ruthenium component, converting them to vapors which deposit themselves on the seals 14. Each component is placed in the cavity 100 of a crucible 102 of carbon or other suitable material. These powdered components are indicated by the reference letters M and R in FIGS. 3 and 4. The positioning coil 98 moves the focus 94 of the converging beam 92 from place to place over the coating material in the cavity 100 of the crucible 102 while the latter is maintained at a negative potential and the ferrous metal magnetic workholder 56 is maintained at a positive potential, as explained more fully below in connection with the operation of the invention. In this manner, the upper surfaces 20 of the seals 14 are coated with an alloy of molybdenum-ruthenium $MO_5Ru_3$ or tungsten-ruthenium $W_3Ru_2$.

Immediately beyond the electron beam guns 88 and 90 in a clockwise direction and separated from them by the sixth dwell station is a laser beam unit 101 including a gas-tight housing 103 supplied with carbon dioxide gas through a pipe 105 and containing a laser 107 emitting a laser beam 109 adapted to play upon and scan each seal 14 in each work holder 56 as it passes beneath the laser 107. The laser 107 requires a power input of 15 to 20 kilowatts to produce the laser beam 109, which is focussed in a small spot rather than in a point upon the workpieces 56 through the intermediate arrangement of a Cassegrainian optical system 111 consisting of a fixed convex mirror 113 combined with a movable annular concave scanning mirror 115 mounted, for example, upon gimbals (not shown) and driven to sweep the focal spot back and forth lengthwise of the seals 14 in successively parallel paths so as to intensely heat the wear-resistant coating 18 of each seal momentarily as the laser beam 109 passes over it. The result is an interaction between the wear-resistant coating layer 18 and the base layer adjacent the upper surface 20 of the base 16 so that the particles of material pass across the intervening surface boundary and interengage one another with an interlocking effect. This interlocking effect prevents the peeling off of the freshly deposited wear-resistant layer 18 and secures it permanently to the base 16. Such laser beam installations are conventional and well known in the optical and welding arts and their details form no part of the present invention. The laser beam treatment just described also tends to close up pores which have occurred in the surface layer 18 as a further preventive measure for the avoidance of the base metal from the base 16 emerging through such pores and smearing over the surface of the engine housing described below in connection with FIG. 6.

About two-thirds of a revolution in a clockwise direction from the loading station 60 is a conveyor station 104 from which the coated seals 14 are conveyed from each workholder 56 to a series of stations 106, 108, 110, 112, 116 arranged in succession. At station 106, the coated seals 14 are subjected to a precautionary acid bath of aqua regia or other acid sufficient to eat away and hollow out the base metal 16 wherever a portion thereof might be exposed as in a pocket, pore or other opening in the coating layer 18. If such an exposed portion of the base metal 16 is permitted to remain on substantially the same level as the coated metal 18, the base metal, during operation of the seal, tends to smear over the coating metal of the above-mentioned engine housing and quickly cause the seal to fail, as has occurred in previous seals coated with titanium carbide.

Station 108 is not an active operating station, but provides the necessary dwell time for the effective action of the acid in hollowing out the base metal 16 below the pore or other undesired minute opening in the coating layer 18. The third station 110 is a rinse station wherein the acid is removed from the seal by passing it through a water dip bath. The fourth station 112 is a drying oven through which the rinsed seals are then passed for removing all liquids from the surfaces thereof. The fifth station 114 is a final honing station whereat the seals are subjected to a fine honing action which gives their surface coating a high polish which enhances their bearing qualities. The sixth station 116 is an unloading station at which the processed seals are removed from the chain of processing stations.

In the method of making the seals 14, a multiplicity of bases 16 are mounted on their respective magnetized work holders 56, with the bottom surfaces 30 of their legs 32 held against the work holder surface 58. The turntable 52 (FIG. 3) is then rotated step-by-step to station 2 where a sensing device (not shown) assures the operator that the seals 14 are correctly loaded on their respective work holders 56. The further rotation of the turntable 52 to station 3 provides for a dwell or idle period thereat. When the workpiece 56 rotates to station 4, it has passed through the outer or low vacuum chamber 70 and at the next step it reaches station 5 where it enters the high-vacuum electron gun chamber 72. There the upper surfaces 20 are subjected to the molybdenum-ruthenium or tungsten-ruthenium deposition brought about by the operation of the two electron guns 88 and 90. The former vaporizes the powdered molybdenum or tungsten in its respective crucible 102, while the latter similarly vaporizes the powdered ruthenium in the latter's crucible 102, as indicated by the letter M in the crucible cavity 100 of FIG. 4.

The mixed vapors of the molybdenum or tungsten and ruthenium deposit themselves as alloys of these elements on the top surfaces 20 of the bases 16. The proper proportions of the two coating elements are achieved by operating the electron guns 88 and 90 for proportionate periods of time. Thus, for molybdenum-ruthenium coating the molybdenum and ruthenium electron guns 88 and 90 respectively are operated for time periods in the proportion of 48 to 42% corresponding to the formula $Mo_5Ru_2$.

Station 6 is an idle station where no action takes place except the settling together of the components applied by the electron guns 88 and 90. At the next station, however, the workpieces are subjected to the effect of a laser beam which runs along the top layer 18 just deposited, at Station 5, and so firmly unites this layer to the adjoining top surface 20 as to prevent scaling off of the layer 18 which might otherwise occur.

Station 8 is another idle station wherein the layer 18 which has been remelted by the laser beam into the top layer of the base portion 16 is permitted to consolidate therewith. At station 9, however, the workpieces 14 are unloaded from the turntable 52 onto the conveyor 104 which carries them to the acid bath of aqua regia. There, as previously stated, the base metal 16 beneath any pores in the wear-resistant coating 18 is eaten away to produce a hollow beneath each pore so that the base metal 16 cannot, during subsequent operation of the seal 14, extrude through the pores and smear over the wear-resistant layer 18 and thus nullify the protective effect of the latter, as has previously occurred with prior seals in the so-called Wankel rotary engine. From the acid bath 106 the workpieces or seals 14 pass through a dwell station 108 and thence through a water rinse station 110 for removing the acid operating at stations 106 and 108. Beyond the rinse station 110, the wet seals 14 are subjected to the heat from the drying oven thereat, so that they emerged dry. The seals 14 then pass through a honing station 114 which imparts a high polish to their wear-resistant layers 18, after which the seals 14 reach the unloading station 116, beyond which they are subjected to any further operations deemed advisable but beyond the scope of the present invention.

In the so-called Wankel engine, the seals 14 of the present invention are mounted upon the tips of the lobes of a roughly triangular rotor (not shown) and cooperate, in sealing engagement, with the so-called trochoidal inner surface 120 (FIG. 6) on the periphery of the inner chamber 122 of the stator or housing 124. The inner surface 120 of the housing 124 is provided with a coating 126 of the same alloy as has been described above as constituting the wear-resistant layer 18 of the seals 14. The coating depositing machine, generally designated 130, for applying the wear-resistant coating 126 to the inner surfaces 120 of an assembly 128 of a multiplicity of such stators or housings 124 is shown in FIGS. 5 and 6. The housings 124 of the assembly 128 are drilled in parallel alignment to receive aligning dowels 129. The machine 130 is provided with an elongated base 132 (FIG. 5) having an upper surface 133 from one end of which rises a stationary end wall 134, preferably integral with the base 132 and with it constituting a frame 136. A conduit 135 leading to a vacuum pump (not shown) is connected to a port 137 in the wall 134. The base 132 near its end opposite the stationary end wall 134 is provided with a guide surface 138 upon which is slidably mounted a movable end wall 140, the bottom surface 142 of which slides along the guide surface 138.

Connected as at 144 to each of the opposite sides 146 of the movable end wall 140 is the headed outer end 148 of a piston 150, the piston head (not shown) of which is reciprocable in an elongated cylinder 152 pivotally mounted on a U-shaped coupled 154 which is pivotally connected by a headed pivot shaft 156 to a bracket 158 projecting laterally from the fixed end wall 134. The combination of elements 148 to 158 constitute a pair of pivoted hydraulic or pneumatic reciprocatory clamping motors, generally designated 160, mounted on opposite sides of the fixed and movable end walls 134 and 140 for tightly clamping a stack of the engine housings or stators 124 in face-to-face engagement with one another. It will be understood that the opposite end surfaces 162 of each stator or housing 124 are machined to a satisfactory degree of flatness and that suitable gaskets (not shown) are inserted between adjacent abutting end surfaces 162 to inhibit leakage therebetween during the operation of the machine 130, as described below.

Mounted on the fixed and movable end walls 134 and 140 are high tension electrical insulators 164 and 166 which are provided with parallel bores 168 (FIG. 6). The bores 168 are of a sufficient size for the temporary passage of guide tubes 170 for the wires 172 to be subsequently exploded in the chamber 122 in a manner described below. The guide tubes 170, as their name indicates, are for the purpose of inserting the wires 172 from end to end of the machine 130, a procedure which would be difficult if not practically impossible without the use of such guide tubes.

The wires 172 are of the same wear-resistant material as employed in coating the seals 14, namely molybdenum-ruthenium or tungsten-ruthenium alloys, except that where the molybdenum-ruthenium alloy is used for the seals 14, the tungsten-ruthenium alloy is used for the housing 124. After the wires 172 have been inserted in the machine 130 by the use of the tubes 170, the tubes 170 are withdrawn and the openings around them in the insulators 154 and 156 are plugged so as to be air-tight, whereupon the ends of the wires 172 at one end of the machine 130 are short-circuited by being joined to one another by a bridging conductor 174 (FIG. 7). The unconnected ends of the wires 172 at the opposite end of the machine 130 are joined by conductors 176 and 178 to the opposite terminals 180 and 182 respectively of the individual capacitors or condensers 184, multiples of which are arranged in a capacitor or condenser bank, generally designated 186.

In the operation of the machine 130, with the wires 172 arranged and connected as described above, and with the assembly 125 of the engine stators or housings 124 aligned with one another along the upper surface 133 of the base 132, and sealed as described above, the fluid pressure clamping motors 160 are supplied with hydraulic or pneumatic pressure fluid from a suitable pump (not shown) in the right-hand ends of their cylinders 152, whereupon the clamping pistons 150 are forced to the left in FIG. 5, thereby tightly urging the end surfaces 162 of the individual motor stators or housings 124 into air-tight sealed engagement with one another. The vacuum pump (not shown) is then started in operation to withdraw air from the aligned engine stators or housings 124. The base 132 of the machine 130 is placed at a positive electrical potential, thereby also placing the engine housings or stators 124 likewise at a positive potential, whereas the wires 172 are placed at a negative potential relatively to the capacitor bank 186. The latter is meanwhile charged with high tension static electricity from a suitable conventional electrostatic electrical generator (not shown) until its charge reaches the desired power of 15 to 20 kilowatts. The discharge of this accumulated high tension electricity is then brought about by the closing of a suitable electrostatic switch (not shown), whereupon the resultant surge of high-powered electrostatic electricity through the wires 172 explodes these wires and vaporizes the alloy of which they are composed. Such exploded wire techniques are described, for example, in the treatise "Exploding Wires", Volume 2, edited by William G. Chace and Howard K. Moore, published by the Plenum Press, New York, N. Y. 1962.

With the explosion of the wires 172, their conversion into vapor fills the chambers 122 of the engine housings or stators 124 and coats their inner surfaces 120 with a layer 126 of the above-described wear-resistant alloy.

The flow of pressure fluid through the hydraulic or pneumatic cylinders 152 is then reversed so as to cause the pistons 150 thereof to move the movable end wall 140 outward away from the fixed or stationary end wall 134, whereupon the individual engine housings or stators 124 are removed from the assembly 125 thereof. The result is that the internal surface 120 of each engine housing or stator 124 is thereby provided with a wear-resistant coating which also extends over the projections 127 which extend toward one another from the trochoidal inner surface 120 of the stator or housing 124. Thus, when the triangular rotor (not shown), equipped with the seals 14 at the outer ends of its three lobes, engages the trochoidal inner surface 120 including the projections 127, the wear-resistant nature of these coatings imparts to the engine a tightly-sealed combustion chamber 122, the tightness of which is of much greater duration and long life than the existing sealing arrangements which have been so unsatisfactory in the rotary engine of the Wankel type.

The modified bar seal coating machine, generally designated 200, shown diagrammatically in FIG. 8 adapts the exploding-wire principle of FIGS. 5 and 6 for coating the seals 14 of FIGS. 1 and 2 with the same alloys, instead of depositing the coating by means of the electron gun and laser machine 50 of FIGS. 3 and 4. The modified machine 200 employs a turntable 202 with circumferentially-spaced workpiece recesses 204 depressed below its upper surface 206 in a manner similar to the turntable 52 with its recesses or magnetic work holders 56 (FIGS. 3 and 4). Stationarily mounted above the turntable 202 with an intervening space 208 therebetween is an exploding wire coating unit, generally designated 210, having a hat-shaped housing 212 including a dome portion 214 rising from a horizontal annular flange or platform 216 disposed above the space 208. Continuous annular outer and inner sealing members 218 and 220 are disposed between the platform 216 and the upper surface 206 of the turntable 202. The opposite sides of the dome portion 214 are bored in alignment to receive tubular electrical insulators 222 and 224 adapted to slidably receive a guide tube 226 which is removable to the right in FIG. 8 when the alloy wire 228 to be exploded has been passed through both insulators 222 and 224 as described more fully below. The sealing members 218 and 220 define a low-vacuum space 230 therebetween while the dome portion 214 defines a high-vacuum space 232, these spaces being connected to low-vacuum and to high-vacuum pumps respectively.

In the operation of the modified bar seal coating machine 200 of FIG. 8, let it be assumed that uncoated workpieces 14 have been placed in the holders 204 of the turntable 202 and that an alloy wire 228 similar to the wires 172 of FIGS. 5 and 6 has been passed through the insulators 222 and 224 with the aid of the guide tube 226, that the guide tube 226 has then been withdrawn and the openings between the wire 228 and the bores of the insulators 222 and 224 are plugged. Let it also be assumed that the turn-table 202 has been placed at a positive electrical potential, thereby also placing the bar seals or other workpieces 14 likewise at a positive potential, while at the same time the wire 228 is placed at a negative potential relatively to a capacitor bank (not shown) similar to the capacitor bank 186 of FIG. 7 and similarly connected thereto. Let it finally be assumed that conventional low-vacuum and high-vacuum pumps (not shown) have been connected to the low-vacuum and high-vacuum spaces 230 and 232 respectively and started in operation to evacuate said spaces 230 and 232.

The capacitor bank is then charged with high tension static electricity as described above in connection with the machine 130 of FIGS. 5, 6 and 7, and then discharged through the alloy wire 228. Thereupon the resultant surge of high-tension static electricity explodes the wire 228 and vaporizes the alloy of which it is composed, as also explained above in connection with the operation of the machine 130. This vapor, spreading throughout the space 232 and downward upon the workpieces 14, deposits thereon wear-resistant coatings 18 of molybdenum-ruthenium or tungsten-ruthenium alloy. The turntable 202 is then rotated to align the next workholder 204 with the housing 214, whereupon a new length of alloy wire 228 is threaded through the insulators 222 and 224 with the aid of the guide tube 226 and the above-described procedure is then repeated.

I claim:

1. A continuous-production apparatus for applying a wear-resistant coating to successive groups of machine element workpieces, said apparatus comprising
    a horizontally disposed rotatable turntable having a planar top surface and a plurality of workpiece holders disposed in an annular path thereon concentric with the axis of rotation thereof in circumferentially spaced relationship relatively to one another, each of said holders being disposed within a separate recess in said top surfaces,
    an air-tight housing disposed adjacent a portion of said path on said turntable and defining with the corresponding portion of said table a chamber therein adapted to be evacuated,
    said housing having a bottom portion which is parallel to said surface and has an opening therein of larger cross-sectional dimensions than any said recess,
    a pair of spaced, generally annular seal rings disposed about said opening and between said bottom portion and said surface,
    means to evacuate said chamber and the volume bounded by said pair of seal rings, turntable surface and bottom portion,
    treating means communicating with said volume,
    a loading station and an unloading station communicating with said turntable.
    means within said chamber for holding an evaporable wear-resistant alloy,
    means in said chamber for evaporating said alloy,
    automated means for indexing said rotatable turntable whereby each group of workpieces is successively received within a said recess at the loading station, carried beneath said housing into a first portion of the evacuated volume, out of said volume and within said opening to receive a vapor deposition of said alloy, into a second portion of said evacuated volume whereby to be exposed to said treating means, and finally out of said volume to the unloading station.

2. An apparatus, according to claim 1, wherein said alloy evaporating means comprises an electron gun for each component of said alloy adapted to direct an electron beam into said alloy holding means.

3. An apparatus, according to claim 1, wherein said alloy evaporating means includes an electrically-insulated mount for a filament of said wear-resistant alloy disposed in said chamber, and also includes means for accumulating and discharging through said mount and said filament a high-tension electrical charge adapted to vaporize said filament.

4. An apparatus, according to claim 1, wherein there is provided beyond said alloy-evaporating means a laser beam projecting device adapted to project a laser beam onto the wear-resistant coating and intensely heat the same into particle-interlocking engagement with the workpiece immediately following the deposition of the wear-resistant coating upon the workpiece.

* * * * *